(12) United States Patent
Zhu et al.

(10) Patent No.: US 10,883,674 B2
(45) Date of Patent: Jan. 5, 2021

(54) LIGHTING DEVICE

(71) Applicant: Xiamen Dong'ang Illumination Technology Co., Ltd., Xiamen (CN)

(72) Inventors: Yubing Zhu, Xiamen (CN); Quanquan Wang, Xiamen (CN); Shibin Hu, Xiamen (CN)

( * ) Notice: Subject to any disclaimer, the term of this patent is extended or adjusted under 35 U.S.C. 154(b) by 258 days.

(21) Appl. No.: 16/051,567

(22) Filed: Aug. 1, 2018

(65) Prior Publication Data
US 2019/0360646 A1    Nov. 28, 2019

(30) Foreign Application Priority Data

May 24, 2018    (CN) .......................... 2018 1 0507665

(51) Int. Cl.
| | |
|---|---|
| *F21L 4/08* | (2006.01) |
| *F21V 23/04* | (2006.01) |
| *F21V 23/06* | (2006.01) |
| *H03K 17/687* | (2006.01) |

(52) U.S. Cl.
CPC ............ *F21L 4/08* (2013.01); *F21V 23/0414* (2013.01); *F21V 23/06* (2013.01); *H03K 17/6871* (2013.01)

(58) Field of Classification Search
CPC . H02J 7/00; H02J 7/0042; F21L 4/085; F21L 4/08; H05B 47/00; H05B 45/00; F21V 23/0414; F21V 23/06; H03K 17/6871
See application file for complete search history.

(56) References Cited

U.S. PATENT DOCUMENTS

| | | | |
|---|---|---|---|
| 7,905,626 B2* | 3/2011 | Shantha | F21V 3/00 |
| | | | 362/228 |
| 10,782,007 B2* | 9/2020 | Grider | F21V 23/06 |
| 2016/0004285 A1* | 1/2016 | Tsai | G06F 1/305 |
| | | | 713/300 |
| 2016/0146443 A1* | 5/2016 | Steiner | F21V 23/001 |
| | | | 362/105 |
| 2017/0040810 A1* | 2/2017 | Hu | H02J 7/00 |
| 2017/0063119 A1* | 3/2017 | Hsiung | H02J 7/00 |
| 2018/0017241 A1* | 1/2018 | Grider | G02B 6/0096 |
| 2020/0096190 A1* | 3/2020 | Huprich | F21V 23/023 |
| 2020/0290535 A1* | 9/2020 | Wang | B60R 16/0307 |

\* cited by examiner

*Primary Examiner* — Borna Alaeddini
(74) *Attorney, Agent, or Firm* — The Law Office of Austin Bonderer, PC; Austin Bonderer (57) ABSTRACT

A lighting device having a removable battery pack is provided. The lighting device comprises a light body and a battery pack. The light body comprises a light-emitting unit and a first universal serial bus (USB) interface electrically coupled to the light-emitting unit. The battery pack comprises a power supply and a second universal serial bus (USB) interface electrically coupled to the power supply. The first USB interface comprises a first data transmission terminal configured for establishing data communication with the second USB interface and a first power terminal for supplying power to the light-emitting unit; the second USB interface comprises a second data transmission terminal for establishing data communication with the first USB interface and a second power terminal for supplying power to the first power terminal. The first data transmission terminal is grounded, and the second data transmission terminal is coupled to a switch circuit.

13 Claims, 8 Drawing Sheets

LIGHTING DEVICE

CROSS-REFERENCE TO RELATED APPLICATIONS

The present application claims the benefit of Chinese Patent Application No. 201810507665.X, filed on May 24, 2018. The above is hereby incorporated by reference.

TECHNICAL FIELD

The subject matter herein generally relates to the field of lighting devices, in particular to a lighting device capable of distinguishing the charging/discharging state of the attached battery pack.

BACKGROUND

Currently, most of lighting devices, such as a flashlight, a torch, that are one-piece do not have batteries that are freely removed. The problem is that when the lighting device is out of power, users have to charge the whole lighting device, including the light body and the battery. Accordingly, the battery life has a serious impact on the work of the lighting device, because the lighting device with a built-in battery cannot continue to work by simply replacing a full-charged battery. Compared with a lighting device having a replaceable battery, the lighting device having built-in battery shows less convenience and less endurance performance. Some of the lighting devices have a replaceable battery with common interface, but most of them must arrange two interfaces (a charging interface and a discharging interface) on the battery just to satisfy the need of charging and discharging.

Moreover, existing lighting devices cannot automatically identify whether a battery is installed correctly or not. If the battery is not installed properly, the current provided from the battery to the light body could be unstable when the lighting device is powered, resulting in damage to the lighting device. Similarly, if an unmatched battery is installed, the lighting device could be damaged as the current and voltage specifications are different.

SUMMARY

It is an object of the present invention to provide an improved lighting device having a removable battery pack, and the battery pack can identify the charging/discharging state by only one interface. More specifically, the lighting device comprises a light body and a battery pack. The light body comprises a light-emitting unit, and a first universal serial bus (USB) interface electrically coupled to the light-emitting unit. The battery pack comprises a power supply, and a second universal serial bus (USB) interface electrically coupled to the power supply. In some embodiments, the first USB interface comprises a first data transmission terminal and a first power terminal; wherein the first data transmission terminal is configured for establishing data communication with the second USB interface, and the first power terminal is configured for supplying power to the light-emitting unit. The second USB interface comprises a second data transmission terminal and a second power terminal; wherein the second data transmission terminal is configured for establishing data communication with the first USB interface, and the second power terminal is configured for supplying power to the first power terminal. Furthermore, the first data transmission terminal is grounded, and the second data transmission terminal is coupled to a switch circuit which is configured to switch on power transmission from the power supply to the second power terminal when the second data transmission terminal is at a low level.

In some embodiments, the first data transmission terminal comprises a first data positive pin and a first data negative pin, wherein the first data positive pin and the first data negative pin are both grounded. The second data transmission terminal comprises a second data positive pin and a second data negative pin, wherein the second data positive pin and the second data negative pin are coupled to the switch circuit. The power supply supplies electric power to the second power terminal through the switch circuit.

In some embodiments, the switch circuit comprises a first metal oxide semiconductor (MOS) transistor. The second data positive pin is coupled to a first MOS transistor gate region; the power supply is coupled to a first MOS transistor drain region; and a first MOS transistor source region is coupled to the second power terminal.

In other embodiments, the switch circuit comprises a second MOS transistor. The second data negative pin is coupled to a second MOS transistor gate region; the power supply is coupled to a second MOS transistor source region; and a second MOS transistor drain region is coupled to the second power terminal.

In alternative embodiments, the switch comprises the first MOS transistor and the second MOS transistor. The negative data pin is coupled to a second MOS transistor gate region; the power supply is coupled to a second MOS transistor source region; and a second MOS transistor drain region is coupled to a first MOS transistor drain region. The second data positive pin is coupled to a first MOS transistor gate region, and a first MOS transistor source region is coupled to the second power terminal.

In some embodiments, the second power terminal is further coupled to a harmonic circuit.

In some embodiments, the second power terminal is further coupled to a Zener diode.

It is another object of the present invention to provide a lighting device having a removable battery. The lighting device at least comprises a light body and a battery pack. The battery pack is coupled to the light body in a removable manner, configured for supplying power to the light body. The light body comprises a first control board, a light emitting unit coupled to the first control board, a first universal series bus (USB) interface electrically coupled to the light-emitting unit through the first control board, and a conductive stick connected to the first control board. The light body is provided with a cavity for receiving the battery pack. The first USB interface is disposed on a bottom of the cavity. The conductive stick is extended from the bottom of the cavity along a direction away from the first control board. The battery pack comprises a second board, a second USB interface, a power supply coupled to the second control board, and a conductive piece coupled to the second control board. The second USB interface is located on a first end of the battery pack which is inserted into the cavity and properly aligned with the first USB interface so that the second. USB interface can couple with the first USB interface when the battery pack is inserted into the cavity. Furthermore, the first end of the battery pack is further provided with a through hole which is aligned with the conductive stick allowing the conductive stick to insert into the battery pack. The conductive piece is located at the bottom of the through hole. When the battery pack is completely inserted into the cavity of the light body, the conductive stick will substantively contact with the conductive piece, and therefore enabling the second control board to control the battery pack to supply power to the light body.

In some embodiments, the first USB interface comprises a first data transmission terminal and a first power terminal. The first data transmission is configured for establishing data communication with the second USB interface, and the first power terminal is configured for supplying power to the light-emitting unit. The second USB interface comprises a second data transmission terminal and a second power terminal. The second data transmission terminal is configured for establishing data communication with the first USB interface; and the second power terminal for supplying power to the first power terminal. Furthermore, the first data transmission terminal is grounded, and the second data transmission terminal is coupled to a switch circuit which is configured to switch on power transmission from the power supply to the second power terminal when the second data transmission terminal is at a low level.

In some embodiments, an outer wall of the battery pack is provided with a seal ring. When the battery pack is inserted into the cavity, the seal ring is fitted with an inner wall of the cavity to reach a seal design.

In some embodiments, the conductive piece comprises a first portion, a second portion, and a third portion that are sequentially connected. The first portion is perpendicular to the second portion in a first direction, and the third portion is perpendicular to the second portion. The third portion is connected to the second control board.

In some embodiments, a first junction between the first portion and the second portion is in a shape of an arc; a second junction between the second portion and the third portion is in a shape of an arc.

In some embodiments, when the conductive stick is abutted against to the first portion of the conductive piece, an offset angle of the first portion is 3°-8°.

In some embodiments, when the conductive stick is abutted against to the first portion of the conductive piece, the offset angle of the first portion is 5°.

In some embodiments, the conductive piece is made of spring steel.

In some embodiments, the length ratio of the first portion, the second portion, and the third portion is 1:1:2.

In some embodiments, a contact end of the conductive stick facing the conductive piece is in a shape of an arc.

DETAILED DESCRIPTION OF THE INVENTION

In order to clarify the objectives, solutions, and advantages of the embodiments of the present invention, the technical solution of the embodiments of the present invention will be described clearly and completely accompanied with the figures.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "electrically coupled" is defined as being in structural, electrical contact, whether directly or indirectly through intervening components, to allow the flow of electrons between the respective elements. The term "comprising" means "including, but not necessarily limited to"; it specifically indicates open-ended inclusion or membership in a so-described combination, group, series and the like.

Figure 1:
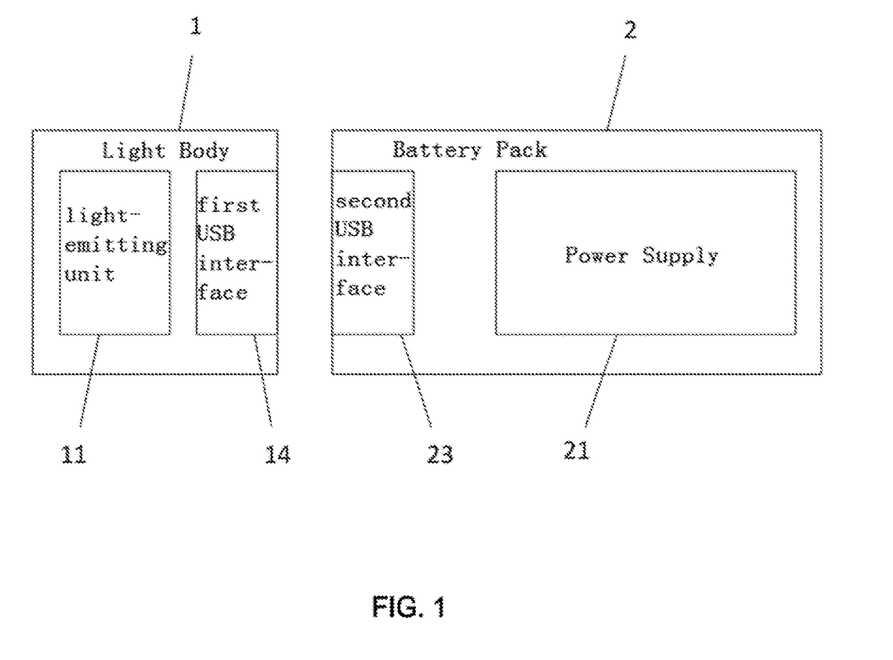
FIG. 1 is a schematic diagram of the lighting device according to one embodiment of the present invention.

FIG. 1 illustrates a lighting device having a removable battery. More specifically, the lighting device comprises a light body 1 and a battery pack 2. The light body 1 comprises a light-emitting unit 11 and a first USB interface 14 coupled to the light-emitting unit 11. The battery pack 2 comprises a power supply VBAT and a second USB interface 23 coupled to the power supply VBAT. The first USB interface 14 of the light body 1 can be coupled to the second USB interface 23 of the battery pack. The coupling of the first USB interface and the second USB interface establishes a signal transmission between the light body 1 and the battery pack 2 and then controlling the power supply VABT of the battery pack 2 to discharge power to the light body 1. The light-emitting unit 11 of the light body 1 can emit light by obtaining the electric power from the battery pack 2. It is to be understood; the light-emitting unit 11 can be any power-driven light-emitting element, e.g., LED light pack, bulb, etc.

Figure 2:
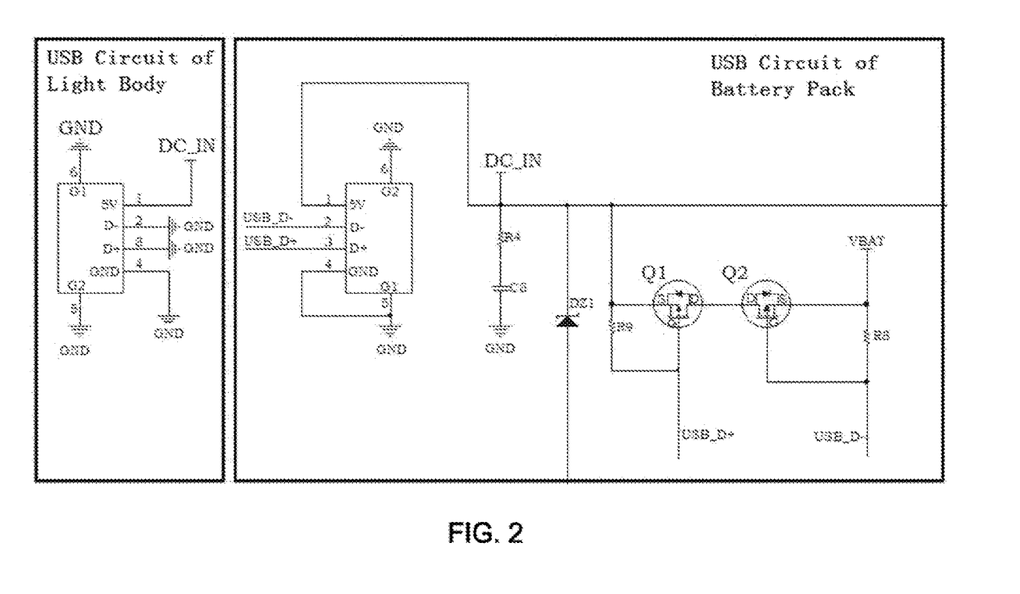
FIG. 2 is a circuit diagram of the USB interface for the lighting body and the battery pack in the lighting device according to one embodiment of the present invention.
Figure 3:
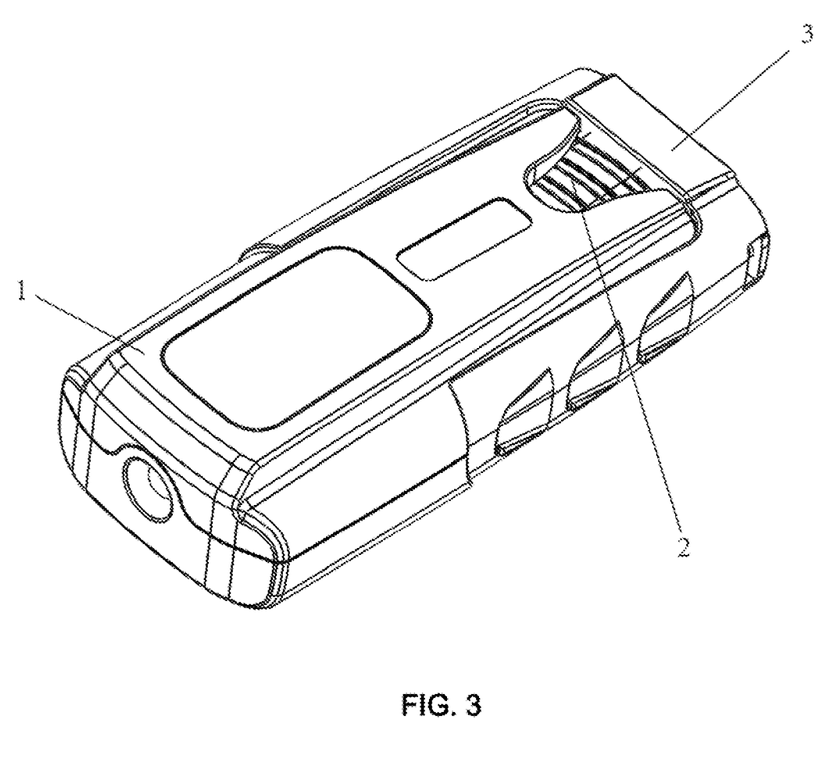
FIG. 3 is a structural diagram of the lighting device according to one embodiment of the present invention.
Figure 4:
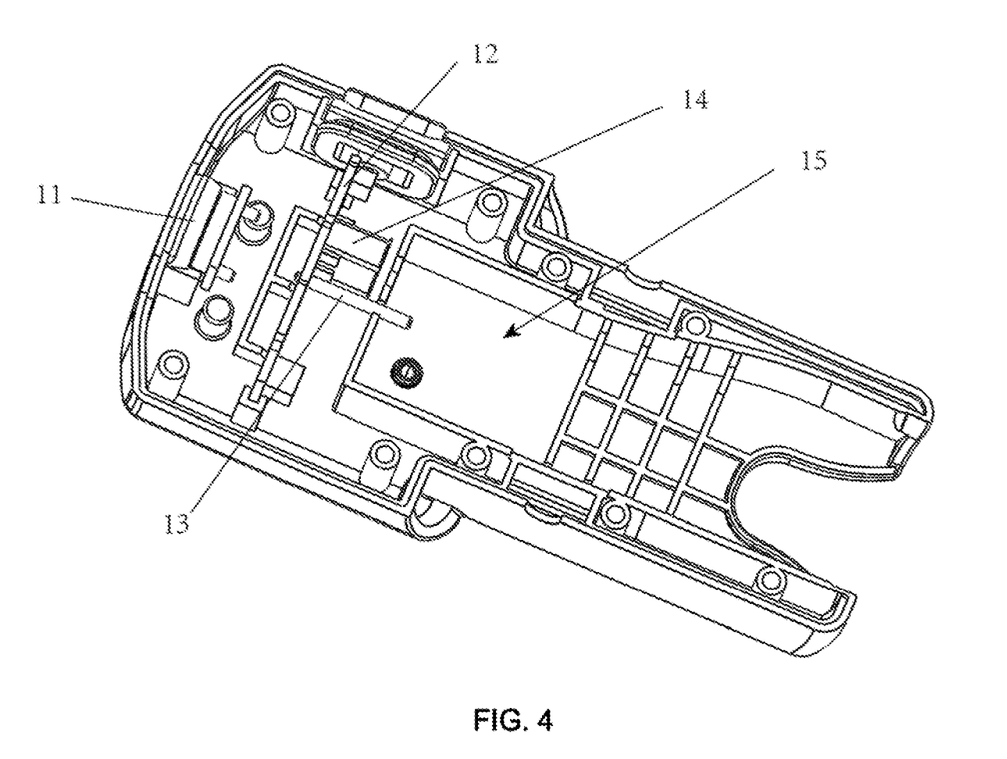
FIG. 4 shows an internal view of the light body used in the lighting device of FIG. 3.
Figure 5:
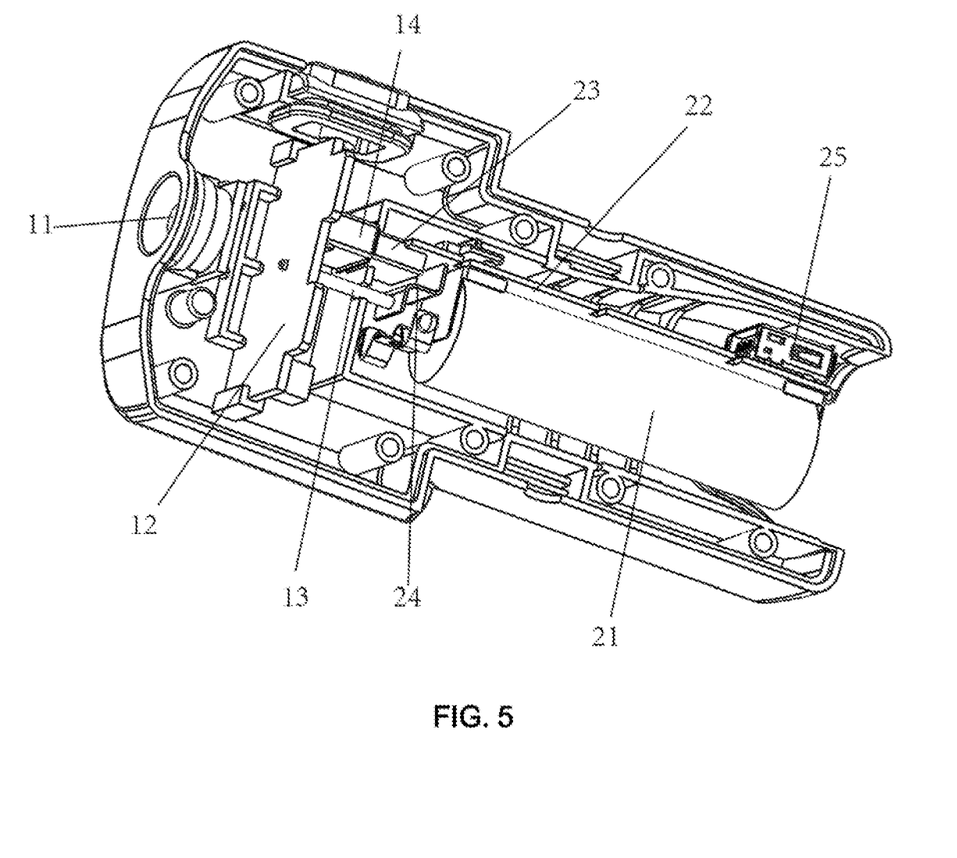
FIG. 5 shows another internal view of the light body used in the lighting device of FIG. 3.
Figure 6:
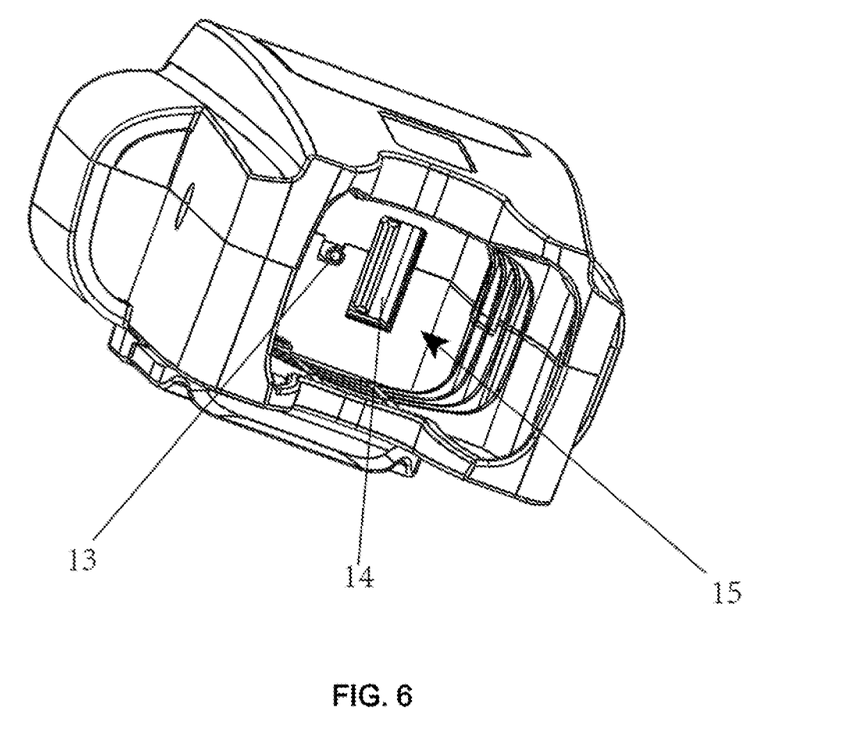
FIG. 6 shows a partial diagram of the light body of the lighting device of FIG. 3.
Figure 7:
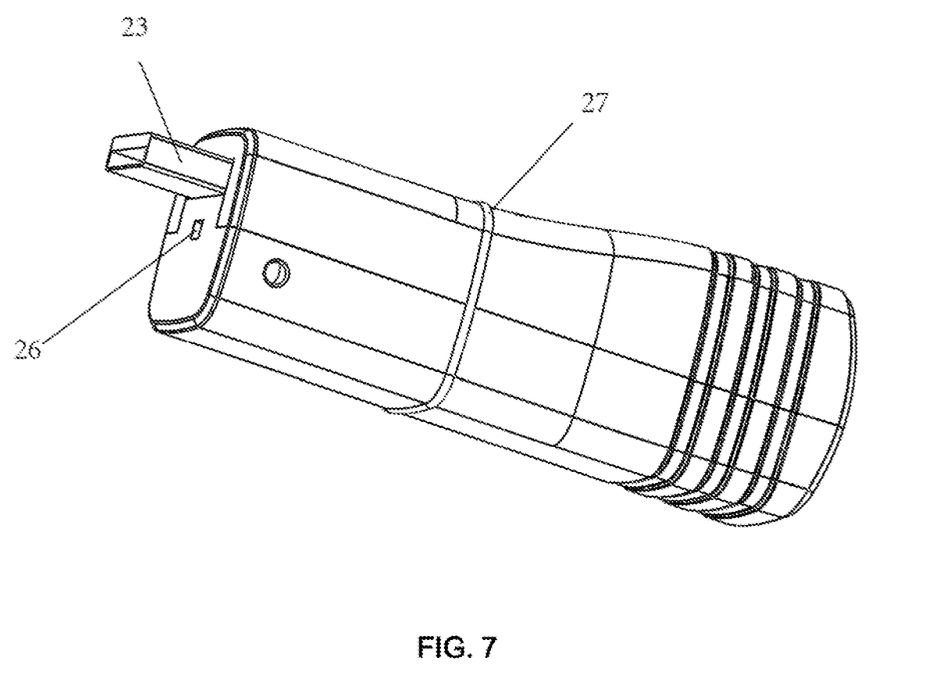
FIG. 7 shows a structural diagram of the battery pack of the lighting device of FIG. 3.
Figure 8:
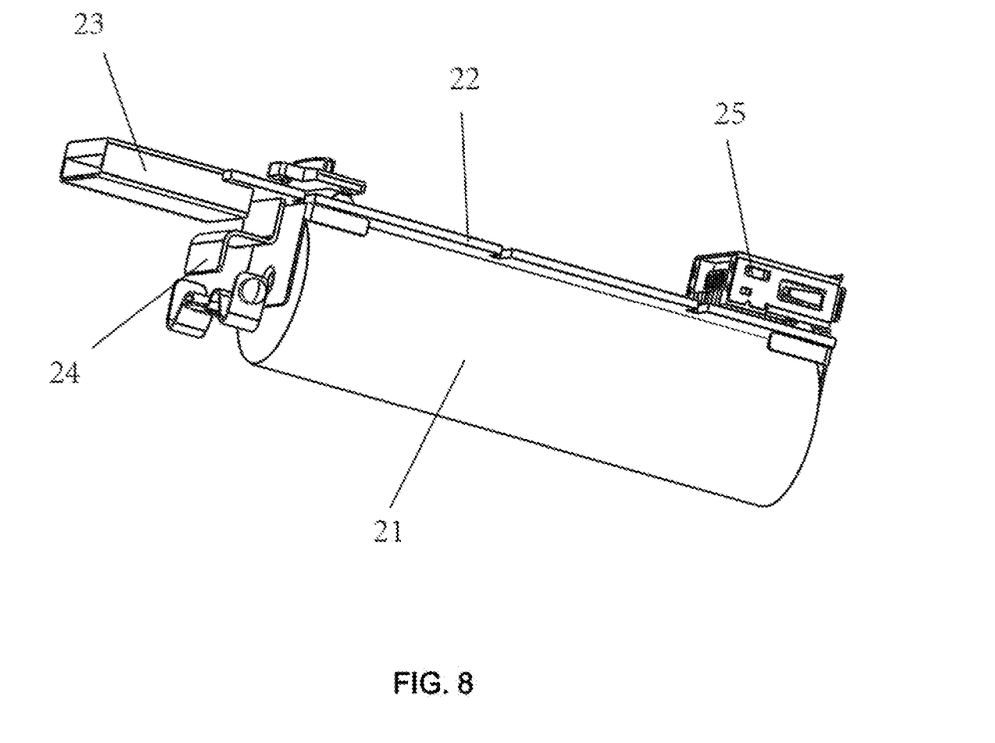
FIG. 8 shows an internal view of the battery pack of the lighting device of FIG. 3.

More specifically, as shown in FIG. 2, the first USB interface 14 of the light body 1 comprises a first data transmission terminal configured for establishing data transmission with the second USB interface 23, and a first power terminal DC_IN configured for transmitting power to the light-emitting unit 11. The second USB interface 23 comprises a second data transmission terminal configured for establishing data transmission with the first USB interface 14, and a second power terminal DC_IN configured for transmitting power to the first power terminal DC_IN. Furthermore, the first data transmission terminal is grounded. The second data transmission terminal is coupled to a switch circuit configured to switch on the electric power transmission from the power supply VBAT to the second power terminal DC_IN when the second data transmission terminal is at a low level. In a further embodiment, the first data transmission terminal comprises a first data positive pin D+ and a first data negative pin D−, wherein the first data positive pin D+ and the first data negative pin D− are both grounded. The second data transmission terminal comprises a second data positive pin D+ and a second data negative pin D−, wherein the second data positive pin D+ and the second data negative pin D− are coupled to the switch circuit. The power VBAT can transmit electric power to the second power terminal DC_IN by the switch circuit.

As shown in FIG. 2, the switch circuit comprises a first MOS transistor Q1 and a second MOS transistor Q2. The second data negative pin D− is coupled to a second MOS transistor gate region, the power supply VBAT is coupled to a second MOS transistor source region, and a second MOS transistor drain region is coupled to a first MOS transistor drain region. The second data positive pin D+ is coupled to a first MOS transistor gate region; and a first MOS transistor source region is coupled to the second power terminal DC_IN.

Furthermore, in some embodiments, as shown in FIG. 2, the input port of the first MOS transistor Q1 is the drain of the first MOS transistor, while the input port of the second MOS transistor Q2 is the source of the second MOS transistor. Such opposite arrangement protects current of the power supply VBAT from leaking to the second power terminal DC_IN when the MOS transistor and the second MOS transistor are cutoff.

In some embodiments, the second power terminal DC_IN can be coupled to a harmonic circuit. As shown in FIG. 2, a capacitor C3 and a resistor R4 are coupled in series, and one end of the series capacitor C3 and resistor R4 is coupled to the second power terminal DC_IN, and the other end being grounded. Furthermore, the second power terminal DC_IN can also be coupled to a Zener diode DZ1. The harmonic circuit and the Zener diode increase the stability of the power supply circuit of the battery pack 2.

Based on the above design, when the battery pack 2 is inserted into the light body 1, the second USB interface 122 of the battery pack 2 fits with the first USB interface 112 of the light body 1. Because the first data positive pin D+ and the second data negative pin D− of the first USB interface 112 are grounded, the second data positive pin D+ and the second data negative pin D− of the second USB interface 122 coupled thereto will be grounded and, therefore, at a state of low level. The state of low level switched on the first MOS transistor Q1 and the second MOS transistor Q2 of the switch circuit. Turning on the first MOS transistor Q1 and the second MOS transistor Q2 enables the power supply VBAT to transmit electric power to the second power terminal DC_IN, the power transmitted to the second power terminal DC_IN then being transmitted to the first power terminal DC_IN of the light body that is coupled with the second power terminal. The light-emitting unit 11 emits light by obtaining power from the first power terminal DC_IN.

In some other embodiments, the switch, circuit may just comprise one first MOS transistor Q1. In this case, for example, the second data positive pin D+ is coupled to the first MOS transistor gate region, the power supply VBAT is coupled to the first MOS transistor drain region, and the first MOS transistor source region is coupled to the second power terminal DC_IN.

In some other embodiments, the switch circuit of the present invention may just comprise one second MOS transistor Q2. In this case, for example, the second data negative pin D− is coupled to the second MOS transistor gate region, the power supply VBAT is coupled to the second MOS transistor source region, and the second MOS transistor drain region is coupled to the second power terminal DC_IN.

The lighting device provided in the present invention makes an improvement to the data transmission terminals of USB interface, so that the data transmission terminal of the battery pack is able to turn low level when the first USB interface of the light body is coupled to the second USE interface of the battery pack. The data transmission terminal of the battery pack turning low level will therefore switched on the switch circuit coupled to the data transmission terminal. Turning on the switch circuit enables the power supply to start charging the light body via the power terminals. When the battery pack is removed from the cavity of the light body, the second USB interface can be used as a charging port for charging the light body. The external power supply may be used to couple to the second USB interface and charge the battery pack directly.

It should be noted that the above-described directional arrangement of the source and drain of the MOS transistors in the switch circuit is only exemplary. Those skilled in the art can also make changes to the direction of the input end and output end of the MOS transistor.

In a second embodiment of the present invention, as shown in FIGS. 3-9, a lighting device is provided. The lighting device comprises a light body 1 and a battery pack 2. The battery pack 2 is detachably attached to the light body 1, configured for supplying power to the light body 1. The light body 1 is provided with a first control board 12, a light-emitting unit 11, a first USB interface 14, and a conductive stick 13 connected to the first control board 12. In this embodiment, the light-emitting unit is coupled to the first USB interface 14 via the first control board 12. In alternative embodiments, however, the light-emitting unit may be directly coupled to the USB interface. Furthermore, the light body 1 is further provided with a cavity 15 for receiving the battery pack 2. The first USB interface 14 is disposed on a bottom of the cavity 15, adjacent to the first USB interface 14. The conductive stick 13 partially extends from the bottom of the cavity 15 along a direction away from the first control board 12. The battery pack 2 comprises a second control board 22, a second USB interface 23, a power supply 21 coupled to the second control board 22, and a conductive piece 24 coupled to the second control board 22. The second USB interface 23 is located on a first end of the battery pack 2 which is inserted into the cavity 15. The second USB interface 23 is properly aligned with the first USB interface 14, so that the second USB interface 23 can couple with the first USB interface 14 when the battery pack 2 is inserted into the cavity 15. Furthermore, the first end of the battery pack 2 is further provided with a through hole 26 which is aligned with the conductive stick 13, allowing the conductive stick 13 to be inserted into the through hole 26. The conductive piece 24 is located at the bottom of the through hole 26. When the battery pack 2 is completely inserted into the cavity 15 of the light body 1, the conductive stick 13 will substantively contact with the conductive piece 24, and therefore enabling the second control board 22 to control the battery pack 2 to supply power to the light body 1.

In some embodiments, as shown in FIG. 2, the first USB interface 14 of the light body 1 comprises a first data transmission terminal and a first power terminal DC_IN. The first data transmission terminal DC_IN is configured for establishing data transmission with the second USB interface 23, and the first power terminal DC_IN is configured for transmitting electric power to the light-emitting unit 11. The second USB interface 23 comprises a second data transmission terminal and a second power terminal DC_IN. The second data transmission terminal is configured for establishing data transmission with the first USB interface 14, and the second power terminal DC_IN is configured for transmitting electric power to the first power terminal. Furthermore, the first data transmission terminal is grounded, and the second data transmission terminal is electrically coupled to a switch circuit for switching on power transmission from the power supply VBAT to the second power terminal DC_IN when the second data transmission terminal is at low level. In some further embodiments, the data transmission terminal comprises a first data positive pin D+ and a first data negative pin D−. The first data positive pin D+ and a first data negative pin D− are both grounded. The second data transmission terminal comprises a second data positive pin D+ and a second data negative pin D−. The second data positive pin D+ and the second data negative pin D− are electrically coupled to the switch circuit, through which the electric power is transmitted from the power supply VBAT to the second power terminal DC_IN. In this embodiment, the switch circuit may be electrically coupled to a second control board 22, so that the second control board 22 can control the on/off state of the switch circuit when the conductive stick 13 contacts the conductive piece 24.

In some embodiments, the first USB interface 14 and the second USB interface 23 can be the circuit used in the first embodiment of the present invention. For example, the circuit scheme is shown in FIG. 2. It should be understood by one with ordinary skill in the art and will not be discussed here for simplicity.

In some embodiments, the battery pack 2 is coupled to the light body 1 through the USB interface and provides power to the light body. The battery pack 2 is removably coupled to the light body, so battery pack 2 can be replaced when the battery pack 2 is running out of power.

It is to be understood that the present invention comprises a conductive stick 13. The design of conductive stick 13 allows identification between the battery pack 2 and the light body. Only a battery pack 2 having a through hole can be coupled with the light body 1 having a conductive stick 13. Also, the battery pack 2 provides power to the light body only when the conductive stick 13 contacts the conductive piece 24.

The battery pack 2 may be partially inserted into the cavity of the light body 1, in which case the second. USB interface 23 will be partially coupled with the first USB interface 14 in a poor connection. Such poor connection will result in the instability of the power transmission between the battery pack 2 and the light body 1 and end up damage to the light body 1. In the present invention, the designs of the conductive stick 13 and the conductive piece 24 form insurance for the USB interfaces. Only when the battery pack 2 is completely inserted into the cavity of the light body 1 and the second USB interface 23 is completely coupled with the first USB interface 14, the battery pack 2 would provide electrical power to the light body 1. As such, damage to the light body caused by the poor connection can be avoided.

In some embodiments, the outer wall of the battery pack 2 is further provided with a seal ring 27 around the same, so that the seal ring 27 is abutted against the inner wall of the cavity 15 of the light body 1 when the battery pack 2 is inserted into the cavity 15 of the light body 1. The seal ring 27 provides more possibility of waterproof when the battery pack 2 is attached to the light body 1.

Figure 9:
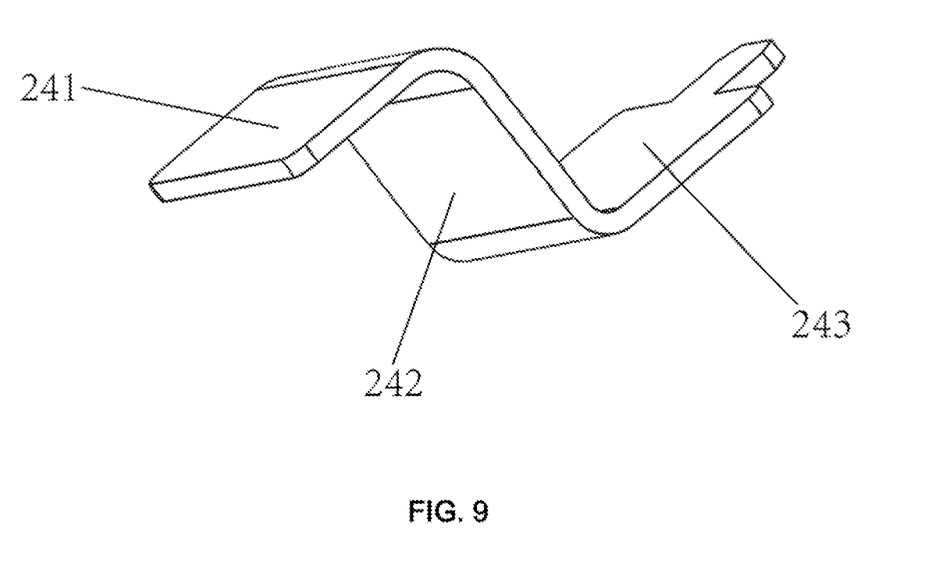
FIG. 9 shows a structural diagram of the conductive piece in the battery pack of FIG. 3.

In order to make the conductive stick 13 come into better contact with the conductive piece 24, the conductive piece 24 is designed to be flexible. The flexible conductive piece 24 can bend by a certain angle when the conductive stick 13 abuts against the conductive piece 24. In some embodiments, the conductive stick and the conductive piece are both made of conductive metal. It is known in the art that metal will be fatigued after being bent many times. In order to avoid the conductive piece 24 being Fatigued and end up failing to back to its origin position, the conductive piece 24 provided in the present invention further comprises a first portion 241, a second portion 242, and a third portion 243. The first portion 241, the second portion 242, and a third portion 243 that are sequentially connected. The first portion 241 is perpendicular to the second portion 242 in a first direction, and the third portion 243 is perpendicular to the second portion 242. The third portion 243 is connected to the second control board 22. As shown in FIG. 9, the conductive piece 24 is in a shape of "Z". The Z-shaped conductive piece has better flexibility which will not be fatigued until a million times bending.

In some embodiments, as shown in FIG. 9, a first junction between the first portion 241 and the second portion 242 is in a shape of an arc; a second junction between the second portion 242 and the third portion 243 is in a shape of an arc. In a further embodiment, the length ratio of the first portion 241, the second portion 242 and the third portion 243 can be 1:1:2. The first portion 241 is configured to in contact with the conductive stick 13, and the third portion 243 is configured to connect to the second control board 22. When the conductive stick 13 abuts against the first portion 241, the third portion 243 will be bent more than the first portion 241, because the third portion 243 is longer than the first portion 241 and they are parallel to each other. Furthermore, the first portion 241 and the third portion 243 are both perpendicular to the second portion 242, which therefore provides more stability when they are applied with forces.

In some embodiments, when the conductive stick 13 is abutted against to the first portion 241 of the conductive piece 24, an offset angle of the first portion 241 may be 3°-8°. In some further embodiments, when the conductive stick 13 is abutted against to the first portion 241 of the conductive piece 24, the offset angle of the first portion 241 may be 5°.

In some embodiments, the conductive piece 24 may be made of spring steel.

In some embodiments, the length ratio of the first portion 241, the second portion 242 and the third portion 243 may be 1:1:2.

In some embodiments, a contact end of the conductive stick 13 facing the conductive piece 24 may be in a shape of an arc. The arc contact end of the conductive stick 13 can increase the contact surface between the conductive stick 13 and the conductive piece 24 and therefore ensures the connection therebetween.

In some embodiments, the light body further comprises a cap 3 for covering the cavity 15. When the battery pack 2 is inserted into the cavity 15, the cap 3 may be used to cover the cavity 15 so that the battery pack 2 will not move out of the cavity 15 and decouple with the light body 1 when being used.

The above are merely preferred embodiments of the present invention and are not intended to limit the present invention. Any modifications, equivalent replacements and improvements made within the spirit and principle of the present invention may be made by one of ordinary skill in the art and shall be comprised in the protection of the present invention.

What is claimed is:

1. A lighting device, comprising
a light body, and
a battery pack;
the battery pack is coupled to the light body in a removable manner, configured for supplying power to the light body;
the light body comprises a first control board, a light-emitting unit coupled to the first control board, a first universal series bus (USB) interface electrically coupled to the light-emitting unit through the first control board, and a conductive stick coupled to the first control board; the light body is further provided with a cavity for receiving the battery pack; the first USB interface is disposed on a bottom of the cavity; the conductive stick is extended from the bottom of the cavity along a direction away from the first control board;

the battery pack comprises a second control board, a second USB interface, a power supply coupled to the second control board, and a conductive piece coupled to the second control board; the second USB interface is located at a first end of the battery pack which is inserted into the cavity; when the battery pack is inserted into the cavity, the second USB interface is aligned with the first USB interface.

2. The lighting device according to claim 1, wherein the first end of the battery pack is further provided with a through hole which is aligned with the conductive stick, the through hole is configured for receiving the conductive stick; and the conductive piece is located at a bottom of the through hole.

3. The lighting device according to claim 1, wherein the first USB interface comprises a first data transmission terminal and a first power terminal; wherein the first data transmission terminal is configured for establishing data communication with the second USB interface, and the first power terminal is configured for supplying power to the light-emitting unit; the second USB interface comprises a second data transmission terminal and a second power terminal; the second data transmission terminal is configured for establishing data communication with the first USB interface, and the second power terminal is configured for supplying power to the first power terminal; and the first data transmission terminal is grounded, and the second data transmission terminal is coupled to a switch circuit which is configured to switch on power transmission from the power supply to the second power terminal when the second data transmission terminal is at a low level.

4. The lighting device according to claim 3, wherein the first data transmission terminal comprises a first data positive pin and a first data negative pin; the first data positive pin and the first data negative pin are grounded;

the second data transmission terminal comprises a second data positive pin and a second data negative pin; the second data positive pin and the second data negative pin are coupled to the switch circuit; the power supply supplies electric power to the second power terminal through the switch circuit.

5. The lighting device according to claim 4, wherein the switch circuit comprises a first metal oxide semiconductor (MOS) transistor;

the second data positive pin is coupled to a first MOS transistor gate region; the power supply is coupled to a first MOS transistor drain region; and a first MOS transistor source region is coupled to the second power terminal.

6. The lighting device according to claim 4, wherein the switch circuit comprises a second metal oxide semiconductor (MOS) transistor;

the second data negative pin is coupled to a second MOS transistor gate region; the power supply is coupled to a second MOS transistor source region; and a second MOS transistor drain region is coupled to the second power terminal.

7. The lighting device according to claim 4, wherein the switch comprises a first metal oxide semiconductor (MOS) transistor and a second MOS transistor;

the second data negative pin is coupled to a second MOS transistor gate region; the power supply is coupled to a second MOS transistor source region; and a second MOS transistor drain region is coupled to a first MOS transistor drain region; and the second data positive pin is coupled to a first MOS transistor gate region, and a first MOS transistor source region is coupled to the second power terminal.

8. The lighting device according to claim 1, wherein an outer wall of the battery pack is provided with a seal ring; and when the battery pack is inserted into the cavity, the seal ring is fitted with an inner wall of the cavity to reach a seal design.

9. The lighting device according to claim 1, wherein the conductive piece comprises a first portion, a second portion, and a third portion that are sequentially connected; the first portion is perpendicular to the second portion in a first direction, and the third portion is perpendicular to the second portion; the third portion is coupled to the second control board.

10. The lighting device according to claim 9, wherein a first junction between the first portion and the second portion is in a shape of an arc; a second junction between the second portion and the third portion is in a shape of an arc.

11. The lighting device according to claim 9, wherein when the conductive stick is abutted against to the first portion of the conductive piece, an offset angle of the first portion is 3°-8°.

12. The lighting device according to claim 9, wherein the conductive stick is abutted against to the first portion of the conductive piece, the offset angle of the first portion is 5°.

13. The lighting device according to claim 1, the conductive piece is made of spring steel.

* * * * *